United States Patent
Hedayati et al.

(10) Patent No.: US 9,602,082 B2
(45) Date of Patent: Mar. 21, 2017

(54) OFFSET INSENSITIVE QUADRATURE CLOCK ERROR CORRECTION AND DUTY CYCLE CALIBRATION FOR HIGH-SPEED CLOCKING

(71) Applicant: Xilinx, Inc., San Jose, CA (US)

(72) Inventors: Hiva Hedayati, San Jose, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/814,401

(22) Filed: Jul. 30, 2015

(65) Prior Publication Data
US 2017/0033774 A1    Feb. 2, 2017

(51) Int. Cl.
*H03K 3/017*    (2006.01)
(52) U.S. Cl.
CPC .................... *H03K 3/017* (2013.01)
(58) Field of Classification Search
CPC .. H03K 3/017; H03K 5/1565; H03K 5/15013; H03K 2005/00052; H03K 2005/00286; H03K 5/135; H03K 5/19; H03K 5/26
USPC ................. 327/170, 172, 174, 175
See application file for complete search history.

(56) References Cited

U.S. PATENT DOCUMENTS

| | | |
|---|---|---|
| 5,506,878 A | 4/1996 | Chiang |
| 6,069,849 A | 5/2000 | Kingsley et al. |
| 6,219,305 B1 | 4/2001 | Patrie et al. |
| 6,285,226 B1 | 9/2001 | Nguyen |
| 6,437,605 B1 | 8/2002 | Lovejoy |
| 6,507,220 B1 | 1/2003 | Groen et al. |
| 6,566,918 B1 | 5/2003 | Nguyen |
| 6,600,355 B1 | 7/2003 | Nguyen |
| 6,690,202 B1 | 2/2004 | Groen et al. |
| 6,788,120 B1 | 9/2004 | Nguyen |

(Continued)

FOREIGN PATENT DOCUMENTS

KR    101428027    8/2014

OTHER PUBLICATIONS

Guo, Jia, "DLL Based Single Slope ADS for CMOS Image Sensor Column Readout", 83 pgs., Aug. 30, 2011, Delft University of Technology.

*Primary Examiner* — John Poos
(74) *Attorney, Agent, or Firm* — Keith Taboada; Joshua Hamberger

(57) ABSTRACT

Techniques for correcting clock distortion. The techniques include use of circuitry for detecting and correcting duty cycle distortion and quadrature clock phase distortion. For phase detection, detection circuitry is made simpler and more accurate through the use of a sampling operation in which device mismatch within detection circuitry is accounted for by sampling charge associated with an ideal clock signal across sampling capacitors. When phase detection is performed with the detection circuitry, the stored charge compensates for the device mismatch, improving the accuracy of the detection circuit. The sampling operation is used for duty cycle distortion detection as well. Specifically, a common mode voltage is applied to sampling capacitors, which effectively zeroes the voltage differential between the sampling capacitors, compensating for offset that might exist due to operation of other components of the detection circuit. A digital value is used by a feedback algorithm to correct the clock distortion.

20 Claims, 8 Drawing Sheets

(56) References Cited

U.S. PATENT DOCUMENTS

| | | |
|---|---|---|
| 6,838,919 B1 | 1/2005 | Kaviani |
| 6,906,571 B1 | 6/2005 | Nguyen |
| 6,924,684 B1 | 8/2005 | Nguyen |
| 7,062,692 B1 | 6/2006 | Lesea |
| 7,308,632 B1 | 12/2007 | Verma et al. |
| 7,437,633 B1 | 10/2008 | Lesea et al. |
| 7,468,615 B1 | 12/2008 | Tan et al. |
| 7,489,173 B1 | 2/2009 | Verma et al. |
| 7,496,155 B1 | 2/2009 | Lu et al. |
| 7,786,782 B2 | 8/2010 | Lien et al. |
| 2005/0275469 A1* | 12/2005 | Metaxakis ............. H03B 27/00 331/16 |
| 2008/0001637 A1 | 1/2008 | Chen et al. |
| 2009/0112555 A1 | 4/2009 | Boerstler et al. |
| 2010/0264890 A1* | 10/2010 | Caldwell ................... G05F 1/56 323/282 |
| 2012/0086489 A1* | 4/2012 | Cherkassky ......... H03K 5/1565 327/175 |
| 2014/0253195 A1* | 9/2014 | Chandrasekaran .. H03K 5/1565 327/175 |

* cited by examiner

US 9,602,082 B2

OFFSET INSENSITIVE QUADRATURE CLOCK ERROR CORRECTION AND DUTY CYCLE CALIBRATION FOR HIGH-SPEED CLOCKING

TECHNICAL FIELD

Examples of the present disclosure generally relate to high speed clocks for integrated circuits and, in particular, to techniques for compensating for clock distortion in high speed clocks.

BACKGROUND

Circuits, such as digital circuits, operate based on a clock signal, which controls the speed at which circuit elements operate. Clock signals are subject to distortion while being transmitted. Circuits are usually designed to minimize, correct, or otherwise compensate for such distortion, so that the level of distortion that clock signals are subject to is within an acceptable tolerance.

As clock frequencies increases, the level of distortion present in the clock signal has a greater relative effect on the clock. Some circuits, such as high speed data links, operate based on a clock having a particularly high frequency (for example, 56 Gb/s). Current techniques for correcting distortion for clocks at such frequencies are inefficient either due to consuming too much power, or too much die area, or do not sufficiently correct distortion.

SUMMARY

A distortion detection unit for detecting distortion of a clock signal is provided. The distortion detection unit includes a duty cycle distortion detection unit, a quadrature clock error detection unit, and one or more sampling capacitors coupled to the duty cycle distortion detection unit and the quadrature clock error detection unit. The duty cycle distortion detection unit and the quadrature clock error detection unit are operable to provide device mismatch-related voltages to the one or more sampling capacitors to charge the one or more sampling capacitors for mismatch correction. The duty cycle distortion detection unit is operable to output a first differential value via the one or more sampling capacitors to indicate a duty cycle distortion polarity of the clock signal. The quadrature clock error detection unit is operable to output a second differential value via the one or more sampling capacitors to indicate a quadrature clock error polarity of the clock signal.

A distortion correction system for correcting distortion of a clock signal is provided. The distortion correction system includes a distortion detection unit operable to detect duty cycle distortion and quadrature clock error distortion. The distortion correction system also includes a clock calibration unit operable to generate a duty cycle distortion correction control signal based on a first output from the distortion detection unit and to generate a quadrature clock error correction control signal based on a second output from the distortion detection unit. The distortion correction system further includes a duty cycle distortion correction unit operable to correct distortion of the clock signal based on the duty cycle distortion correction control signal and based on the quadrature clock error correction control signal.

The distortion detection unit includes a duty cycle distortion detection unit, a quadrature clock error detection unit, and one or more sampling capacitors coupled to the duty cycle distortion detection unit and the quadrature clock error detection unit. The duty cycle distortion detection unit and the quadrature clock error detection unit are operable to provide device mismatch-related voltages to the one or more sampling capacitors to charge the one or more sampling capacitors for mismatch correction. The duty cycle distortion detection unit is operable to output a first differential value via the one or more sampling capacitors to indicate a duty cycle distortion polarity of the clock signal. The quadrature clock error detection unit is operable to output a second differential value via the one or more sampling capacitors to indicate a quadrature clock error polarity of the clock signal.

A method for correcting distortion of a clock signal is provided. The method includes providing device mismatch-related voltages to one or more sampling capacitors to charge the one or more sampling capacitors for mismatch correction. The method also includes outputting a first differential value via the one or more sampling capacitors to indicate a duty cycle distortion polarity of the clock signal. The method further includes outputting a second differential value via the one or more sampling capacitors to indicate a quadrature clock error polarity of the clock signal.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for correcting clock distortion are provided. The techniques include use of circuitry for detecting and correcting duty cycle distortion and quadrature clock phase distortion. Duty cycle distortion refers to the variation from a desired duty cycle (usually 50-50) and quadrature clock phase distortion refers to the variation from a difference of 90 degrees between I and Q signals. For phase detection, detection circuitry is made simpler and more accurate through the use of a sampling operation in which device mismatch within detection circuitry is accounted for by sampling charge associated with an ideal clock signal across sampling capacitors. When phase detection is performed with the detection circuitry, the stored charge compensates for the device mismatch, improving the accuracy of the detection circuit. The sampling operation is used for duty cycle distortion detection as well. Specifically, a common mode voltage is applied to sampling capacitors, which effectively zeroes the voltage differential between the sampling capacitors, compensating for offset that might exist due to operation of other components of the detection circuit. For example, the stored charge compensates for device mismatch that would lead to common mode voltage error for the clock signals, when the clock signal is applied to the detection circuit. For both phase and duty cycle distortion, a difference related to phase or duty cycle distortion is amplified and a resulting bit is stored in a latch, which is applied to calibration logic that includes digital logic for providing a phase or duty cycle correction adjustment to the clock signal.

Figure 1:
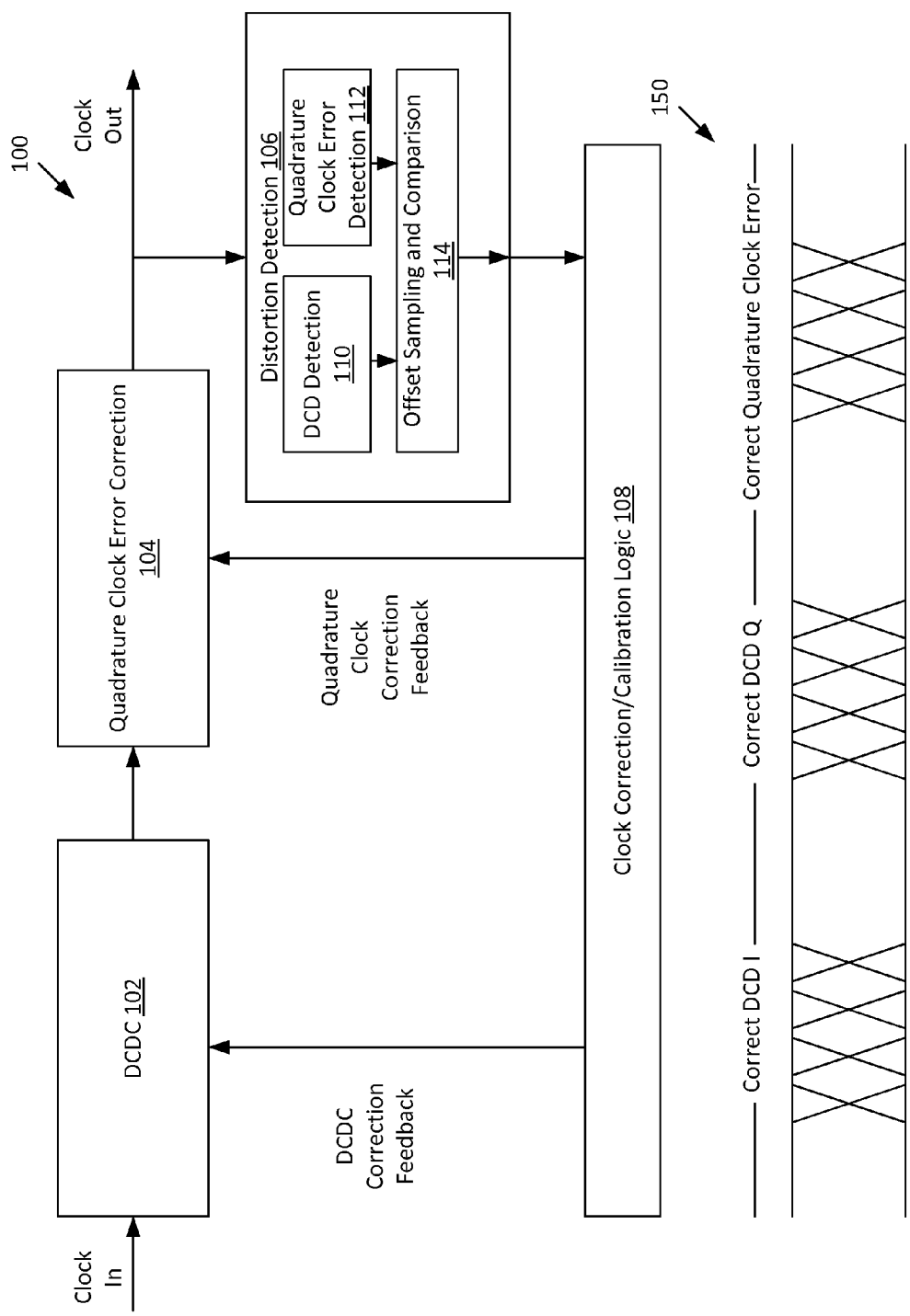
FIG. 1 illustrates a distortion correction system, according to an example.

FIG. 1 illustrates a distortion correction system 100, according to an example. As shown, the distortion correction system 100 includes a duty cycle distortion correction (DCDC) unit 102, a quadrature clock error correction unit 104, a distortion detection unit 106, and calibration logic 108. The distortion correction system 100 receives a clock signal from a clock signal transmitter and detects and corrects distortion in that clock signal to produce a corrected clock signal. The distortion correction system 100 may be used to correct clock distortion for a wide variety of electronic devices such as different types of general purpose computers (desktops, laptops, tablets, mobile devices), data transfer devices (such as networking devices or internal data communication subsystems), and the like.

The components of the distortion correction system 100 implement a feedback loop to correct an input clock ("clock in") to produce clock output ("clock out"). More specifically, DCDC unit 102 corrects the input clock for DC distortion and quadrature clock error correction unit 104 corrects the input clock for quadrature clock error. Distortion detection unit 106 detects distortion, both duty cycle distortion, via DCD detection unit 110 and quadrature clock error via quadrature clock error detection unit 112 and generates distortion indicator signals that indicate whether distortion is detected via offset sampling and comparison unit 114 for output to calibration logic. Calibration logic 108 applies feedback control to both DCDC unit 102 and quadrature clock error correction unit 104 in order to correct for distortion. Thus, distortion detection unit 106 and calibration logic 108 alter the level of correction applied by DCDC unit 102 and quadrature clock error correction unit 104 based on the output from DCDC unit 102 and quadrature clock error correction unit 104 to form a feedback loop.

Graph 150 indicates the order in which distortion is corrected. DCDC is determined first, then quadrature clock error is determined. Note that the clock signal (i.e., both clock in and clock out) includes both in-phase and quadrature phase components ("I" and "Q," respectively) as well as complementary signals for the in-phase and quadrature phase components ("Ib" and "Qb," respectively), where complementary signals represent the negated version of the signals for which they are complementary. According to graph 150, DCD correction is corrected first for I and Ib, then for Q and Qb, and subsequently, quadrature clock error is corrected. Because quadrature clock error relates to phase difference (specifically, to the degree to which phase variation between I and Q differs from the 90 degree difference that should exist between I and Q), quadrature clock error is determined for both I and Q signals at the same time. Note that both the input ("clock in") and output ("clock out") include I and Q as well as Ib and Qb signals.

Figure 2A:
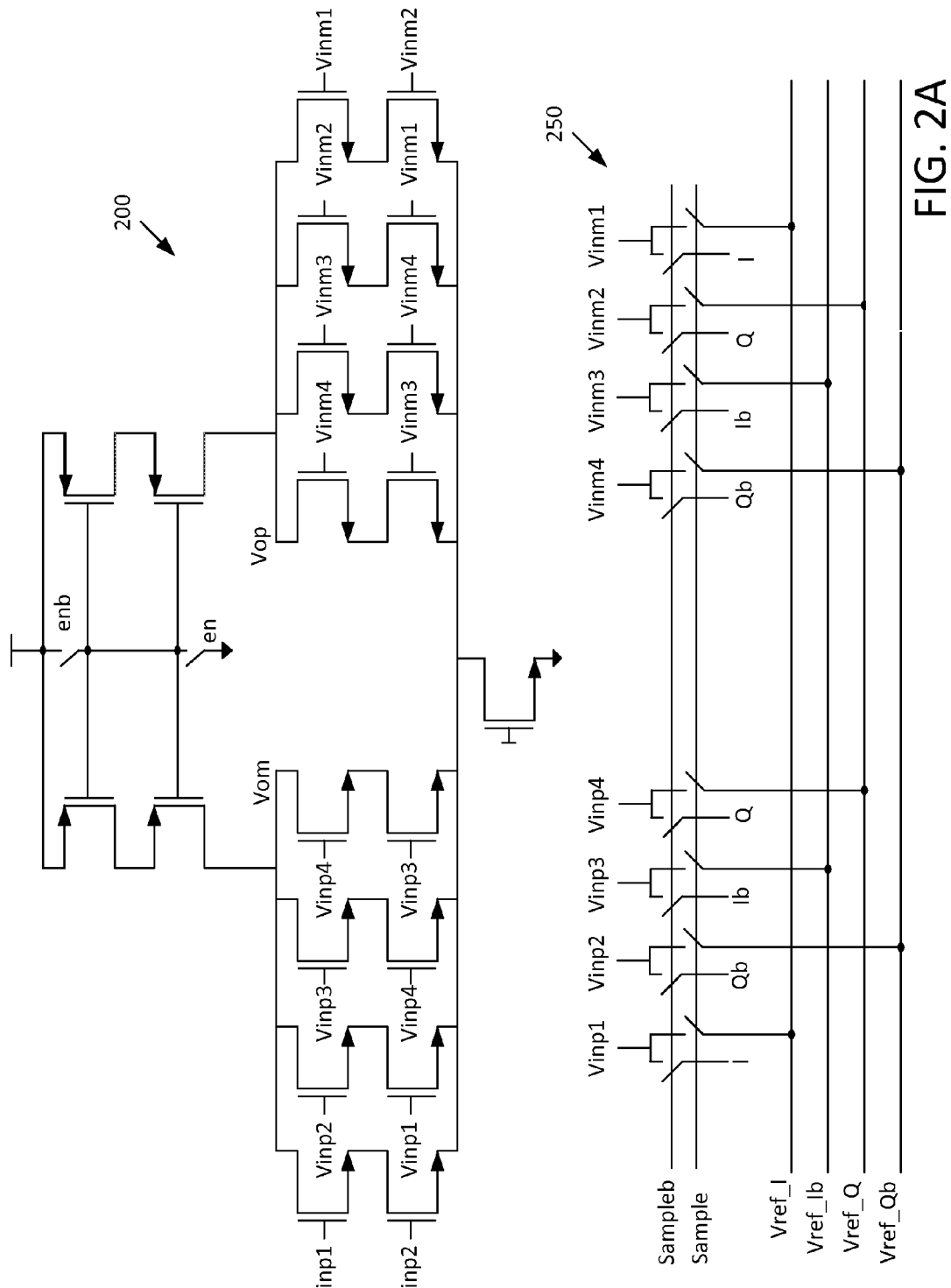
FIG. 2A is a circuit diagram of a quadrature phase detection unit, according to an example.

FIG. 2A is a circuit diagram of a quadrature clock error detection unit 200, according to an example. The quadrature clock error detection unit 200 is an example of a circuit that could be used as quadrature clock error detection unit 112 of FIG. 1.

Quadrature clock error detection unit 200 includes a series of transistors arranged into a series of exclusive OR ("XOR") gates that act as a phase detection circuit. More specifically, the phase detection circuit includes a set of two pairs of P-channel ("PMOS") metal-oxide semiconductor field effect transistors ("MOSFETs"), each pair connected in series, and eight pairs of N-channel ("NMOS") transistors, each pair connected in series, as well as other components as described. For the PMOS transistors, the sources of the top of each pair are connected to a power supply voltage and the drains of the bottom transistors are coupled to an output node. Specifically, the left side drain is coupled to a negative output node ("Vom") and the right side drain is coupled to a positive output node ("Vop"). The gates of the PMOS transistors are coupled to two switches that selectively couple the gates to either power supply or ground. The switch coupled to ground is controlled by an enable which is high when clock calibration is desired (thus activating the PMOS transistors) and low when clock calibration is disabled. The switch coupled to the power supply is controlled by a negative enable signal (enb) which is inverted from the enable signal. Thus, enb deactivates the PMOS transistors when activated.

Quadrature clock error detection unit 200 includes NMOS transistors coupled together in pairs and in groups of 8 to form XOR gates. Eight NMOS transistors are coupled to the negative output node Vom and eight other NMOS transistors are coupled to the positive output node Vop. Each group of 8 includes four pairs of NMOS transistors organized in a symmetric configuration. Each pair includes a top transistor with a drain coupled to the positive or negative output node and a bottom transistor with a source coupled to the drain of another NMOS transistor that acts as a current source and couples the 8 pairs of transistors to ground. The gates of each transistor on the left side are coupled to inputs such as Vinp1 through Vinp4 and the gates of each transistor on the right side are coupled to inputs such as Vinm1 through Vinm4. On the left side, two pairs are coupled to Vinp1/Vinp2, with a reversal of order for symmetry (since the input signal may experience different loading depending on whether it is applied to the top or bottom transistor). Thus, one pair has top and bottom transistors coupled to Vinp1/Vinp2 and another pair has top and bottom transistors coupled to Vinp2/Vinp1. Similarly, two other pairs are coupled to Vinp3/Vinp4 and Vinp4/Vinp3. For the right side, two pairs are coupled to Vinm1/Vinm2 and Vinm2/Vinm1 and two other pairs are coupled to Vinm3/Vinm4 and Vinm4/Vinm3.

As shown in selection circuitry 250, the positive inputs (Vinpx) and negative inputs (Vinmx) are selectively coupled, via switches, to either a generated, ideal clock signal (Vref_x) (when the sample signal is asserted) or to the input clock signal that is to be corrected (when the sample signal is not asserted and the sampleb signal, which is the inverse of the sample signal, is asserted). The ideal clock signal is a set of voltages generated locally to emulate what is deemed to be an ideal clock. The ideal clock signal includes components I, Q, Ib, and Qb. The voltages chosen for these components may be voltages for ideal I, Q, Ib, and Qb clock components at any point in time. An ideal clock may be a clock with a 50-50 duty cycle and where I and Q signals are 90 degrees out of phase. The voltages for the I, Q, Ib, and Qb components of the ideal clock may be, for example, VCC, GND, GND, and VCC (corresponding to the earliest point in time of graph 280 of FIG. 2B), or, in another example, GND, GND, VCC, and VCC (corresponding to the last point in time in FIG. 2B). The purpose of the ideal clock signal is to charge sampling capacitors (described below) with charge that is based on the mismatch between the devices (e.g., transistors) of the quadrature clock error detection unit 200. More specifically, if no mismatch were to exist, the output differential when an ideal clock is input to the NMOS transistors would be zero (i.e., Vop−Vom would equal 0). However, if a mismatch exists (which is generally the case), then some differential would exist between Vop and Vom with the ideal clock signal applied. The sampling capacitors are described below at least with respect to FIG. 3.

Once the sampling capacitors are charged based on the ideal clock signal, the sample signal is de-asserted, the sampleb signal is asserted, and the switches in selection circuitry 250 select the clock signal to be applied to the NMOS transistors. Vop and Vom produce a differential output that is positive if the phase difference between I and Q is greater than 90 degrees and that is negative if the phase difference between I and Q is less than 90 degrees. Note that due to the effects of parasitic capacitance, in steady state, Vop and Vom are essentially average voltage values while the clock signal to be corrected is connected to the NMOS gates. The charge stored across the sampling capacitors compensate for the mismatches in devices in the quadrature clock error detection unit 200 by affecting the signal that is output through those sampling capacitors.

Figure 2B:
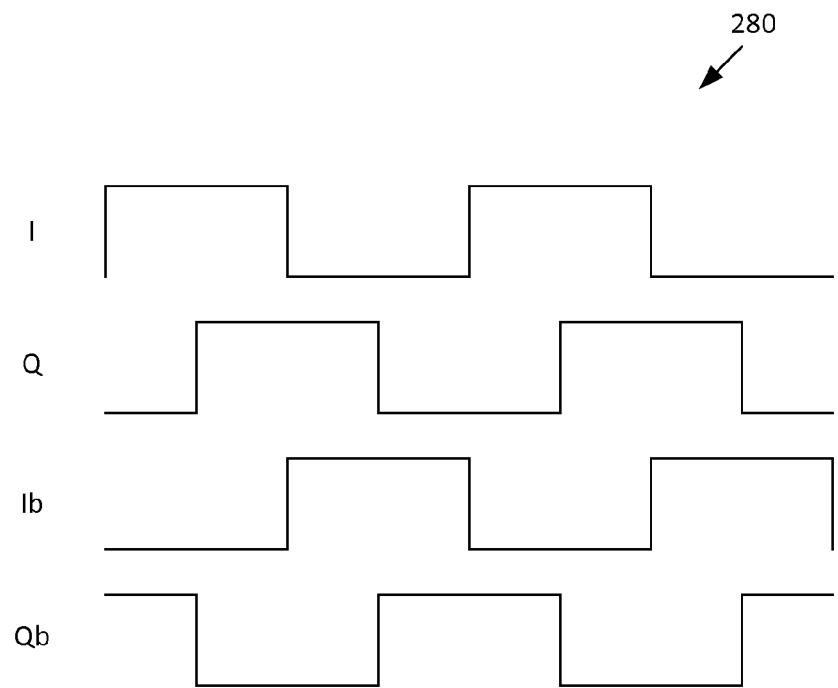
FIG. 2B is a graph illustrating the clock signals discussed herein, according to an example.

FIG. 2B is a graph 280 illustrating the clock signals discussed herein, according to an example. Waveforms are provided to illustrate the quadrature clock. Signal I, the in-phase signal, is a square wave as shown. Q is the quadrature phase signal, which is out of phase of I by 90 degrees. Ib and Qb are the inverse of I and Q, respectively.

Figure 3:
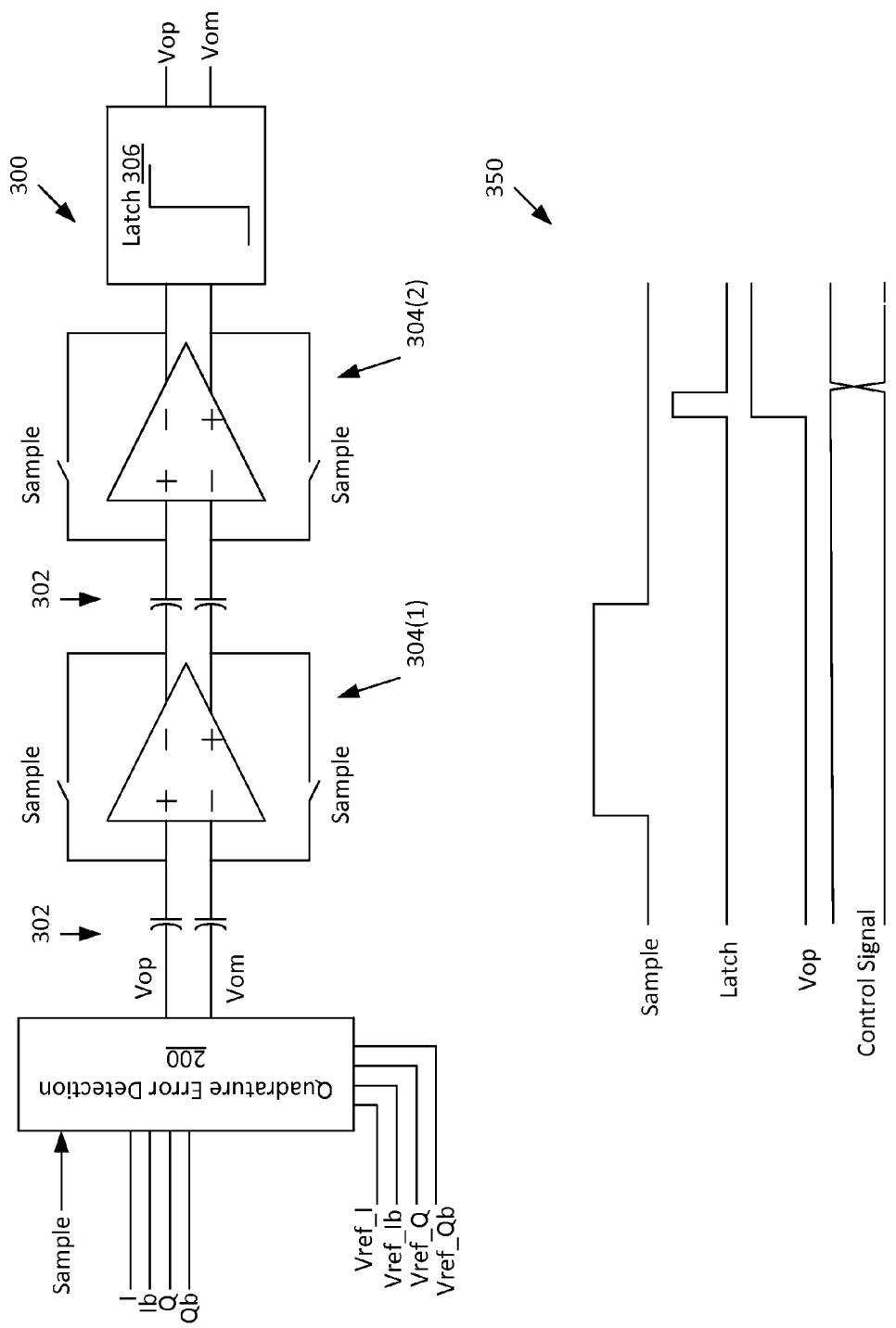
FIG. 3 is a circuit diagram of an offset sampling and comparison unit, according to an example.

FIG. 3 is a circuit diagram of an offset sampling and comparison unit 300, according to an example. The offset sampling and comparison unit 114 of FIG. 1 may be the offset sampling and comparison unit 300 of FIG. 3. FIG. 3 also shows an operation graph 350 that indicates the manner in which the quadrature clock error detection unit 200 of FIG. 2 works in conjunction with the offset sampling and comparison unit 300 to generate a distortion detection signal.

The outputs from quadrature clock error detection unit 200 include the Vop and Vom (positive and negative outputs) illustrated in FIG. 2A. These outputs are applied to a set of sampling capacitors 302 which sample the outputs when the ideal clock input is applied to the quadrature clock error detection unit 200 as described above. The switches labeled "sample" are closed during sampling to operate the differential amplifiers in closed loop configuration and are opened after sampling to retain the charge stored on the capacitors. At this time, when sample switches are open, the clock signal is applied to the NMOS capacitors of FIG. 2A to detect phase distortion.

The first differential amplifier 304(1), which may be an operational amplifier, has negative and positive inputs and negative and positive outputs. The first differential amplifier 304(1) amplifies a difference between the signals received, outputting a resulting positive amplified signal at the positive output and a resulting negative amplified signal at the negative output. Note that two stages are differential amplifier 304 are shown, in order to increase the gain to improve the ability to resolve difference between Vop and Vom of the quadrature clock error detection unit 200. Differential latch 306 stores a bit that results from the output of the differential amplifiers 304. This bit is output to calibration logic 108 for correction of phase. Note that although two differential amplifier 304 stages are shown, more or fewer (e.g., 1 or 3) differential amplifier 304 stages may be included in quadrature clock error detection unit 200.

Referring momentarily back to FIG. 1, calibration logic 108 includes digital logic that implements a feedback algorithm to search for a phase-aligned clock signal. The calibration logic 108 may implement an algorithm for this purpose. In one example, calibration logic 108 may simply sweep from minimum to maximum calibration values by, for example, counting a calibration value up and determining when the bit received from latch 306 changes value. Calibration logic 108 may thus include components such as a counter, a latch or flip flop, and a comparator, organized to implement this search. In another example, calibration logic may implement a binary search algorithm, which, instead of sweeping by one count value at a time, may change the calibration value by larger values at first and then by smaller values until a particular calibration value is found that is deemed to be close enough to when the output of latch 306 switches. Any number of other search algorithms may be implemented digitally in calibration logic 108. Calibration logic 108 may thus include the components to implement such algorithms, such as, again, counters or value change circuitry, comparators, and storage units such as latches or flip flops to store previous latch 306 values and to store the current calibration value.

Figure 4:
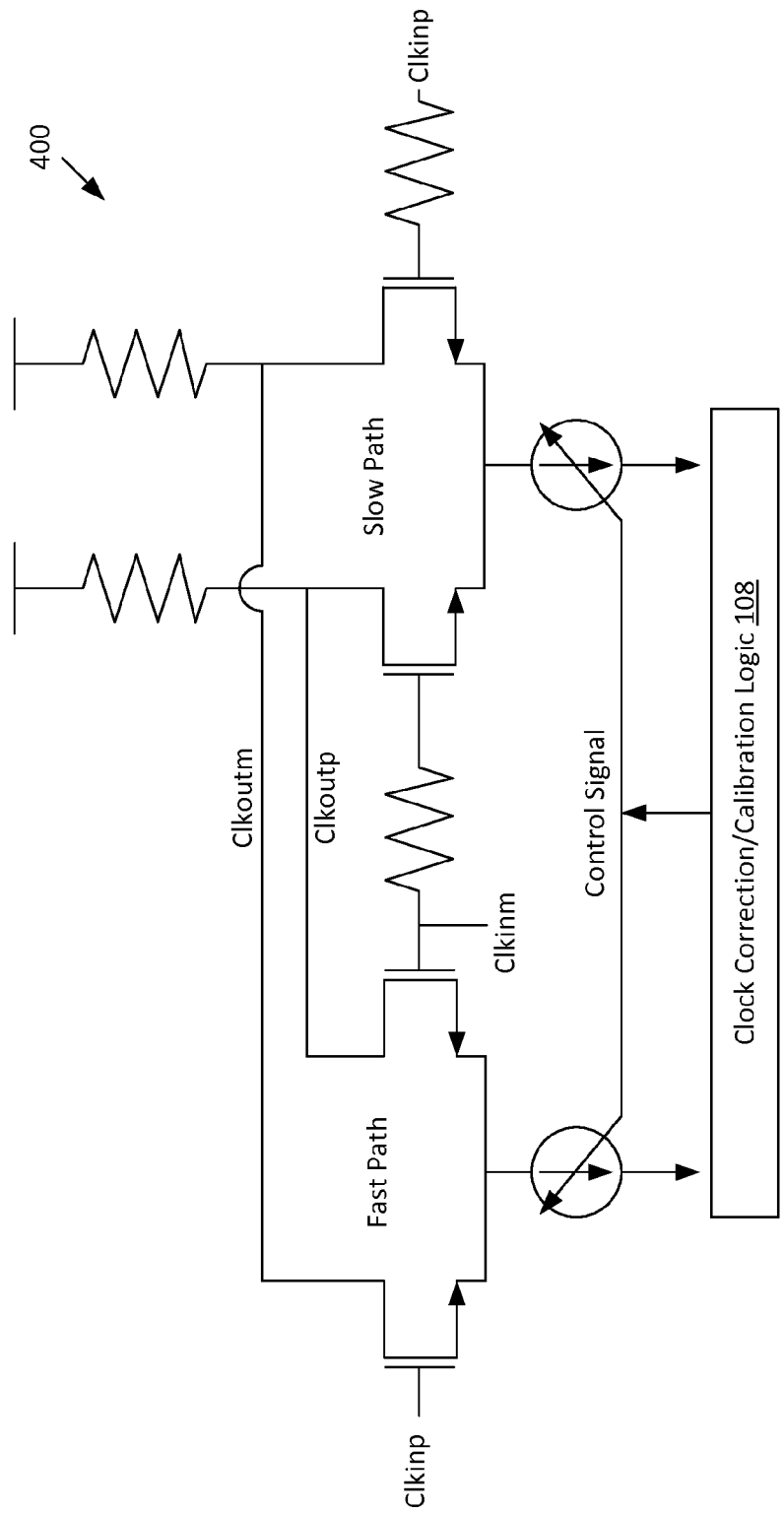
FIG. 4 is a circuit diagram of a quadrature clock error correction unit, according to an example.

FIG. 4 is a circuit diagram of a quadrature clock error correction unit 400, according to an example. The quadrature clock error correction unit 400 may be used as the quadrature clock error correction unit 104 of FIG. 1.

The quadrature clock error correction unit 400 includes a "fast path" and a "slow path." Each path includes two NMOS transistors having drains coupled to output nodes and having sources coupled to variable current sinks whose current is controlled by the output signal from clock correction/calibration logic 108. The gates are coupled to a clock input, either without a resistor for the fast path or with a resistor for the slow path. For each of slow path and fast path, the transistor with a gate coupled to the positive input clock ("clkinp") is coupled to the negative output node ("clkoutm") and the transistor with a gate coupled to the negative input clock ("clkinm") is coupled to the positive output node ("clkoutp").

In operation, the control signal applied by clock correction/calibration logic 108 to the fast path and the slow path controls the amount of current flowing through each path. With higher current flowing through the fast path, the output signals (both clkoutm and clkoutp) are less delayed, as the voltage and the output node changes faster. With higher current flowing through the slow path, the output signals (both clkoutm and clkoutp) are more delayed, due to operation of the resistors at the gates of the transistors of the slow path.

Note that the value of the control signal applied to the fast path differs from the value applied to the slow path in order to achieve the abovementioned variation in delay. In one example, clock correction/calibration logic 108 may generate a complementary signal that includes one higher and one lower value. In other words, the signals applied to the variable current sinks include a first value and a second value that equals a maximum value minus the first value. For example, if 7 bits are used for the control signal and the first value is 80, the second value would be 47. Alternatively, two control signal values may be provided by clock correction/calibration unit 108 for application to the variable current source or other ways of varying the current through fast path and slow path may be used. Note also that quadrature clock error correction 104 may include one quadrature clock error correction unit 400 for each of I and Q so that the delay for each of those clock components can be adjusted in order to correct phase. The control signal applied to each quadrature clock error correction unit 400 may be complementary as described above or may be different in a different way.

Figure 5:
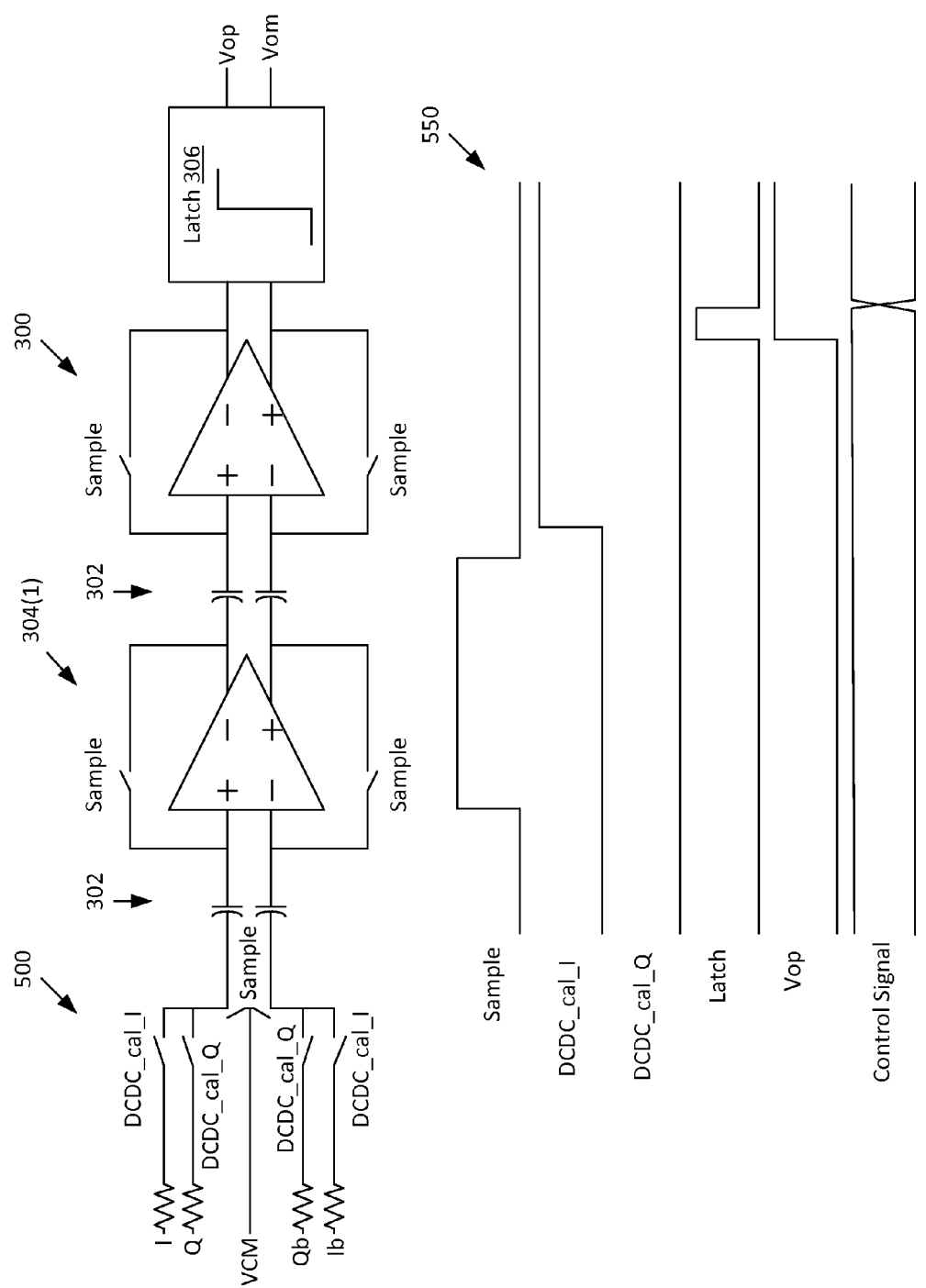
FIG. 5 illustrates a duty cycle distortion detection circuit, according to an example.

FIG. 5 illustrates a duty cycle distortion detection circuit 500 ("DCD detection circuit"), according to an example. The duty cycle distortion detection circuit 500 may be used as the duty cycle distortion detection unit 110 of FIG. 1. For conciseness, the details of the DCD detection circuit 500 are shown in the context of an offset sampling and comparison unit 300 shown and described with respect to FIG. 3.

The DCD detection circuit 500 includes four resistors, each coupled to one of I, Q, Qb, or Ib and to switches DCDC_cal_I or DCDC_cal_Q. A common mode voltage input ("VCM") is coupled to sample switches for charging the sampling capacitors to calibrate for the common mode voltage.

In operation, I is first calibrated and then Q is calibrated (or Q might be calibrated before I). With reference to the timing diagram 550, to calibrate I and Q, first the sample signal is asserted, which closes the sample switches. The sampling capacitors 302 are charged based on the common mode signal, which represents an average voltage between the high and low oscillations of the clock signal. Charging the sampling capacitors 302 based on VCM zeroes the voltage differential at the sampling capacitors 302, which provides compensation for differential voltage error that may be caused by various components of the distortion correction system.

Once the sampling capacitors 302 are charged, sample switches are open, and calibration is done for either I or Q. To calibrate I, the DCDC_cal_I switch is closed, which causes the I signal to flow across the resistor and to the offset sampling and comparison unit 300 and causes and Ib to flow across the resistor and to the offset sampling and comparison unit 300. Due to action of the resistor and parasitic capacitances, the voltage at the input to the differential amplifiers 304 from I will be greater than that for Ib if I has a duty cycle that is greater than 50% and will be less than Ib if I has a duty cycle that is less than 50%. The charge stored on sampling capacitors 302 compensates for offset in VCM and may also compensate for offset in the differential amplifiers 304. The difference is amplified by the differential amplifier and stored in latch as an indicator bit. The indicator bit is applied to clock correction/calibration logic 108 which adjusts the duty cycle for I via DCDC unit 102. After correction for I is applied, correction for Q is applied in a similar manner. More specifically, DCDC_cal_Q is asserted (while DCDC_cal_I is of course not asserted) and the output from latch 306 is stored and applied to correction/calibration logic 108 which adjusts the duty cycle for Q via DCDC unit 102. The graph 550 shows some example values for the Vop output and the like.

Figure 6:
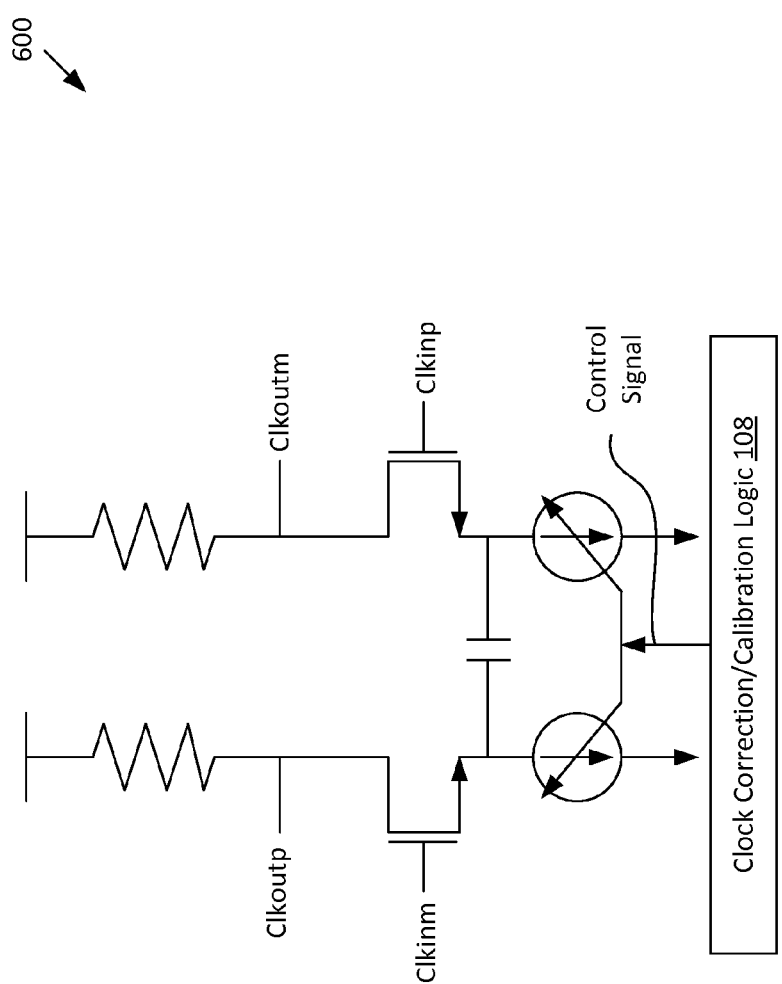
FIG. 6 illustrates a duty cycle correction circuit, according to an example.

FIG. 6 illustrates a duty cycle correction circuit 600, according to an example. The duty cycle correction circuit 600 may be used in the DCD correction unit 102 of FIG. 1. As shown, the duty cycle correction circuit 600 includes two NMOS transistors with drains coupled, through resistors, to the power supply and with sources coupled to a capacitor and to variable current sinks coupled to ground and controlled by control signal received from correction/calibration logic 108. The control signal may be a multi-bit signal used by correction/calibration logic 108 to adjust the duty cycle. The left NMOS transistor has a gate coupled to the negative input clock ("Clkinm") and a drain coupled to a positive output clock ("Clkoutp") and the right NMOS transistor has a gate coupled to the positive input clock ("Clkinp") and a drain coupled to a negative output clock ("Clkoutm"). Note that DCD correction unit 102 may include two duty cycle correction circuits 600—one for I and one for Q.

When the current is greater through the current sink coupled to the left side as compared with the right side, voltage at Clkoutp transitions faster and the duty cycle is shortened (i.e., the clock is "high" for a shorter amount of time) and when the current is less through the current sink coupled to the left side as compared with the right side, voltage at Clkoutm transistions slower and the duty cycle is lengthened (i.e., the clock is "high" for a longer amount of time).

Note that although various features and functions are described as being performed by specific circuitry, some of the functions may be performed by other circuitry as known in the art.

Figure 7:
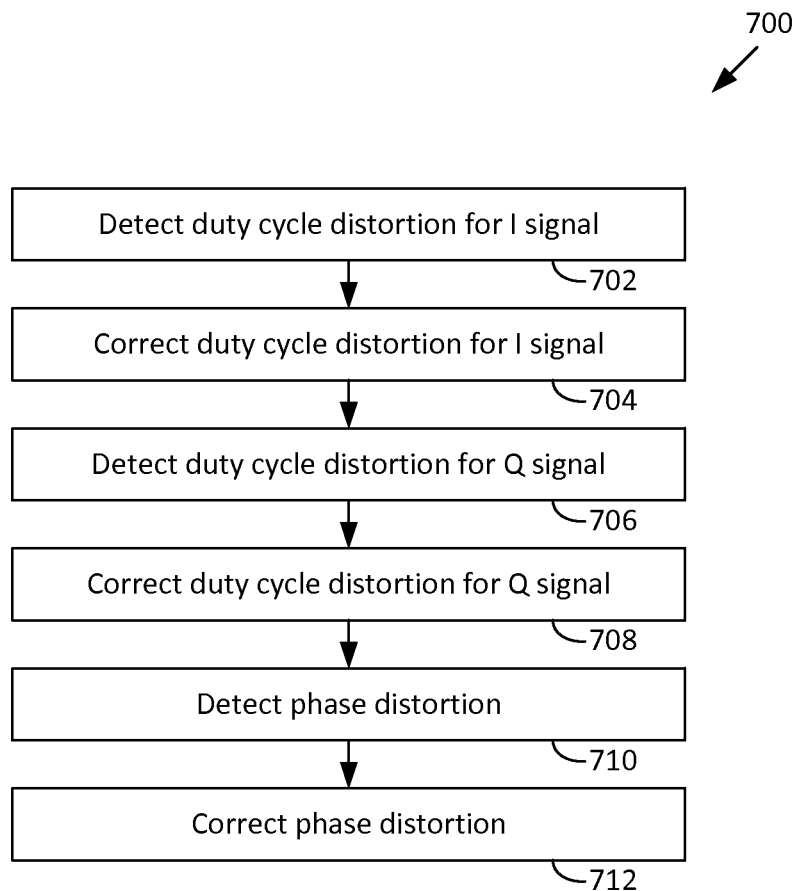
FIG. 7 is a flow diagram of a method for correcting duty cycle distortion and quadrature clock distortion, according to an example.

FIG. 7 is a flow diagram of a method 700 for correcting duty cycle distortion and quadrature clock distortion, according to an example. Note that although described with respect to the system of FIGS. 1-6, any system that performs the described operations, in various technically feasible alternative orders, falls within the scope of the present disclosure.

At operation 702, distortion correction system 100 detects duty cycle distortion in the I signal. This may be done with the duty cycle distortion detection circuit 500 illustrated in FIG. 5. Briefly, as described above, duty cycle distortion detection involves sampling for error in a common mode voltage, and amplifying the differential between non-inverted and inverted output clock to obtain a bit indicative of whether the duty cycle is greater or less than 50-50. Detection also involves outputting an indicator bit to clock correction/calibration logic 108, which outputs a control value as described above.

At operation 704, distortion correction system 100 corrects for duty cycle distortion in the I signal. This may be done with the duty cycle distortion correction circuit 600 of FIG. 6. Briefly, this circuit is controlled by a control signal provided from a clock correction/calibration logic 108 which adjusts two variable current sources coupled to NMOS transistors configured as described with respect to FIG. 6. The duty cycle is adjusted based on the value of the variable current source. At operations 706 and 708, distortion correction system 100 detects and corrects for duty cycle distortion in the Q signal in a similar manner as with the I signal.

At operation 710, distortion correction system 100 detects phase distortion, which is a difference in phase between I and Q signals that is less than or greater than 90 degrees. This may be accomplished with quadrature clock error detection unit 200 of FIG. 2A. Briefly, this circuit uses symmetric XOR gates with ideal clock inputs and sampling capacitors to store charge related to device mismatch in the quadrature clock error detection unit 200. Subsequently, the inputs to the symmetric XOR gates are set to the actual clock input which causes the circuit to output voltages related to phase distortion (i.e., phase difference other than 90 degrees). The output voltage are affected by device mismatch in quadrature clock error detection unit 200 but the charges stored across sampling capacitors effectively compensate for the device mismatch. An offset sampling and comparison unit 114 amplifies the differential signal output by quadrature clock error detection unit 200, and the amplified value is stored in a latch. The value indicates the direction of phase distortion (either greater than or less than 90 degrees) and is input to clock correction/calibration logic 108 that adjusts a control signal for quadrature clock correction.

At operation 712, distortion correction system 100 corrects the phase distortion according to the control signal. This may be accomplished by quadrature clock error correction unit 400 of FIG. 4. Specifically, a variable current source coupled to NMOS devices arranged as shown in FIG. 4 apply a greater current either to a slow path or a fast path, which adjusts the delay applied to I and Q signals. Note that quadrature clock error correction units 400 may be included for both I and Q signals and may adjust both of those signals.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A distortion detection unit for detecting distortion of a clock signal, comprising:
   a duty cycle distortion detection unit;
   a quadrature clock error detection unit; and
   one or more sampling capacitors coupled to the duty cycle distortion detection unit and the quadrature clock error detection unit,
   wherein the duty cycle distortion detection unit and the quadrature clock error detection unit are operable to provide device mismatch-related voltages to the one or more sampling capacitors to charge the one or more sampling capacitors for mismatch correction,
   wherein the duty cycle distortion detection unit is operable to output a first differential value via the one or more sampling capacitors to indicate a duty cycle distortion polarity of the clock signal, and
   wherein the quadrature clock error detection unit is operable to output a second differential value via the one or more sampling capacitors to indicate a quadrature clock error polarity of the clock signal.

2. The distortion detection unit of claim 1, further comprising:
   one or more differential amplifiers operable to amplify the first and second differential values to generate a first amplified differential value and a second amplified differential value.

3. The distortion detection unit of claim 1, further comprising:
   a differential latch operable to store a bit based on the first differential value.

4. The distortion detection unit of claim 1, wherein:
   the quadrature clock error detection unit includes a plurality of transistors configured into a plurality of exclusive OR ("XOR") gates operable to detect quadrature clock error in the clock signal.

5. The distortion detection unit of claim 4, wherein the plurality of transistors are configured in a symmetric configuration.

6. The distortion detection unit of claim 4, wherein the quadrature clock error detection unit further comprises:
   a plurality of switches configured to apply a set of ideal clock voltages to the plurality of transistors to generate a device mismatch-related voltage of the device mismatch-related voltages.

7. The distortion detection unit of claim 4, wherein the quadrature clock error detection unit further comprises:
   a plurality of switches configured to apply the clock signal to the plurality of transistors to generate the first differential value.

8. The distortion detection unit of claim 1, wherein:
   the clock signal includes an in-phase clock signal, an inverted in-phase clock signal, a quadrature-phase clock signal, and an inverted quadrature-phase clock signal.

9. The distortion detection unit of claim 1, wherein:
   the duty cycle distortion detection unit includes a set of resistors coupled to the clock signal and to the sampling capacitors and operable to generate a differential signal based on duty cycle distortion of the clock signal.

10. A distortion correction system for correcting distortion of a clock signal, the distortion correction system comprising:

a distortion detection unit operable to detect duty cycle distortion and quadrature clock error distortion;

a clock calibration unit operable to generate a duty cycle distortion correction control signal based on a first output from the distortion detection unit and to generate a quadrature clock error correction control signal based on a second output from the distortion detection unit;

a duty cycle distortion correction unit operable to correct distortion of the clock signal based on the duty cycle distortion correction control signal and based on the quadrature clock error correction control signal, wherein the distortion detection unit comprises:

a duty cycle distortion detection unit;

a quadrature clock error detection unit; and one or more sampling capacitors coupled to the duty cycle distortion detection unit and the quadrature clock error detection unit, wherein the duty cycle distortion detection unit and the quadrature clock error detection unit are operable to provide device mismatch-related voltages to the one or more sampling capacitors to charge the one or more sampling capacitors for mismatch correction, wherein the duty cycle distortion detection unit is operable to output a first differential value via the one or more sampling capacitors to indicate a duty cycle distortion polarity of the clock signal, and wherein the quadrature clock error detection unit is operable to output a second differential value via the one or more sampling capacitors to indicate a quadrature clock error polarity of the clock signal.

11. The distortion correction system of claim 10, wherein the distortion detection unit further comprises:

one or more differential amplifiers operable to amplify the first and second differential values to generate a first amplified differential value and a second amplified differential value.

12. The distortion correction system of claim 10, wherein the distortion detection unit further comprises:

a differential latch operable to store a bit based on the first differential value.

13. The distortion correction system of claim 10, wherein:

the quadrature clock error detection unit includes a plurality of transistors configured into a plurality of exclusive OR ("XOR") gates operable to detect quadrature clock error in the clock signal.

14. The distortion correction system of claim 13, wherein the plurality of transistors are configured in a symmetric configuration.

15. The distortion correction system of claim 13, wherein the quadrature clock error detection unit further comprises:

a plurality of switches configured to apply a set of ideal clock voltages to the plurality of transistors to generate a device mismatch-related voltage of the device mismatch-related voltages.

16. The distortion correction system of claim 13, wherein the quadrature clock error detection unit further comprises:

a plurality of switches configured to apply the clock signal to the plurality of transistors to generate the first differential value.

17. The distortion correction system of claim 10, wherein:

the clock signal includes an in-phase clock signal, an inverted in-phase clock signal, a quadrature-phase clock signal, and an inverted quadrature-phase clock signal.

18. The distortion correction system of claim 10, wherein:

the duty cycle distortion detection unit includes a set of resistors coupled to the clock signal and to the sampling capacitors and operable to generate a differential signal based on duty cycle distortion of the clock signal.

19. A method for correcting distortion of a clock signal, the method comprising:

providing device mismatch-related voltages to one or more sampling capacitors to charge the one or more sampling capacitors for mismatch correction;

outputting a first differential value via the one or more sampling capacitors to indicate a duty cycle distortion polarity of the clock signal; and outputting a second differential value via the one or more sampling capacitors to indicate a quadrature clock error polarity of the clock signal.

20. The method of claim 19, wherein outputting the first differential value comprises:

detecting quadrature clock error in the clock signal via a plurality of transistors configured into a plurality of exclusive OR ("XOR") gates.

\* \* \* \* \*